(12) United States Patent
Teranishi et al.

(10) Patent No.: US 6,558,507 B1
(45) Date of Patent: May 6, 2003

(54) PLASMA PROCESSING APPARATUS

(75) Inventors: Koji Teranishi, Yokohama (JP); Atsushi Yamagami, Kawasaki (JP); Satoshi Takaki, Komae (JP)

(73) Assignee: Canon Kabushiki Kaisha, Tokyo (JP)

( * ) Notice: Subject to any disclaimer, the term of this patent is extended or adjusted under 35 U.S.C. 154(b) by 5 days.

(21) Appl. No.: 09/664,339

(22) Filed: Sep. 18, 2000

Related U.S. Application Data

(62) Division of application No. 08/853,449, filed on May 9, 1997, now Pat. No. 6,145,469.

(30) Foreign Application Priority Data

May 21, 1996 (JP) .............................. 8-125770

(51) Int. Cl.[7] .......................... C23C 16/00; C23F 1/02
(52) U.S. Cl. ........................ 156/345.45; 156/345.43; 118/723 E
(58) Field of Search ............. 118/723 E, 723 ER, 118/723 I, 723 IR, 723 AN; 156/345

(56) References Cited

U.S. PATENT DOCUMENTS

| | | | |
|---|---|---|---|
| 4,158,717 A | 6/1979 | Nelson | 428/446 |
| 4,461,819 A | 7/1984 | Nakagawa et al. | 430/59 |
| 4,664,890 A | 5/1987 | Tawada et al. | 422/186 |
| 5,261,962 A | 11/1993 | Hamamoto et al. | 118/723 |
| 5,277,751 A | 1/1994 | Ogle | 156/643 |
| 5,383,984 A * | 1/1995 | Shimada et al. | 156/345 |
| 5,531,834 A | 7/1996 | Ishizuka et al. | 118/723 |
| 5,540,781 A | 7/1996 | Yamagami et al. | 118/723 |
| 5,554,223 A * | 9/1996 | Imahashi | |
| 5,571,366 A | 11/1996 | Ishii et al. | 156/345 |
| 5,653,811 A | 8/1997 | Chan | 118/723 |
| 5,970,907 A | 10/1999 | Takai et al. | 118/723 |
| 6,065,425 A | 5/2000 | Takaki et al. | 118/723 |
| 6,145,469 A * | 11/2000 | Teranishi et al. | 118/723 E |

FOREIGN PATENT DOCUMENTS

EP 0 517 042 12/1992

OTHER PUBLICATIONS

R. Martins, et al., "Analysis of a New Production Technique for Amorphous Silicon Solar Cells", 5th E.C. Photovoltaic Solar Energy conf., pp. 778–782 (1983).

J. Patscheider, et al., "Plasma–Induced Deposition of Thin Films of Aluminum Oxide", Plasma Chem. and Plasma Proc., vol. 12, No. 2, pp. 129–145 (1992).

H. Curtins, et al., "Influence of Plasma Excitation Frequency for a–Si:H Thin Film Deposition", Plasma Chem. and Plasma Proc., vol. 7, No. 3, pp. 267–273 (1987).

* cited by examiner

*Primary Examiner*—Gregory Mills
*Assistant Examiner*—Luz L. Alejandro
(74) *Attorney, Agent, or Firm*—Fitzpatrick, Cella, Harper & Scinto

(57) ABSTRACT

A plasma processing apparatus has a substrate holder, arranged in a vessel which can be reduced in pressure, for placing a substrate to be processed there on, a process gas fed into the reaction vessel, and a cathode electrode for supplying a high-frequency wave power from a high-frequency wave power source to an interior of the reaction vessel through a matching circuit, and is characterized in that at least a part of the reaction vessel is constituted by a dielectric member, and the cathode electrode is arranged outside the reaction vessel, so that a plasma distribution in the reaction vessel is made uniform and a uniform plasma process for a substrate to be processed is made possible. The plasma process includes CVD, sputtering, etching or ashing.

8 Claims, 13 Drawing Sheets

PLASMA PROCESSING APPARATUS

CROSS-REFERENCE TO RELATED APPLICATIONS

This application is a division of U.S. patent application Ser. No. 08/853,449 filed May 9, 1997, now U.S. Pat. No. 6,145,469.

BACKGROUND OF THE INVENTION

1. Field of the Invention

The present invention relates to a plasma processing apparatus and a processing method and, more particularly, to a plasma processing apparatus and a processing method such as: a plasma CVD apparatus and a film forming method for a crystalline or non-monocrystalline functional deposition film effective for an electrophotographic photosensitive device serving as a semiconductor device, an image input line sensor, an image-pickup device, or a photomotive device; a sputtering apparatus and a film forming method which can preferably form a semiconductor device, an insulating film serving as an optical element, or a metal wire; or an etching apparatus and method for a semiconductor device.

2. Related Background Art

As a plasma process used in forming a semiconductor or the like, various methods are used depending on applications. For example, an apparatus and a method using the characteristics of a plasma, such as film formation for an oxide film, a nitride film, and an amorphous-silicon-based semiconductor film using a plasma CVD method; film formation for a metal wiring film or the like using a sputtering method; or a micropatterning technique or the like using etching. In addition, in recent years, a demand for improvement of film quality and processing performance becomes strong, and various devices are examined. In particular, since a plasma process using a high-frequency power has stable discharging and can be applied to an insulating material of an oxide film or a nitride film, the plasma process is widely applied.

Conventionally, the oscillation frequency of a discharging high-frequency wave power source used in a plasma process such as plasma CVD is generally 13.56 MHz. A plasma CVD apparatus generally used in deposition film formation is shown in FIG. 13. FIG. 13 shows a film formation apparatus for a cylindrical amorphous-silicon film (to be referred to as an a-Si film hereinafter) for a cylindrical electrophotographic photosensitive material. A film forming method for an a-Si film will be described below with reference to FIG. 13.

The film formation apparatus shown in FIG. 13 is constituted such that, in a reaction vessel 101 which can be reduced in pressure, a cylindrical cathode electrode 102 electrically insulated from the reaction vessel 101 and a cylindrical film-formed substrate 103 serving as a counter electrode are arranged by an insulating material 113. The film-formed substrate 103 is heated to a predetermined temperature by a heater 105 arranged in the film-formed substrate 103, and is held on a substrate holder 104 having a rotating mechanism driven by a motor 112. A high-frequency wave power source 106 is connected to the cathode electrode 102 through a matching circuit 107. An evacuating means 108 for evacuating the reaction vessel 101 and a gas supply means 109 for supplying a gas into the reaction vessel 101 are attached to the film formation apparatus.

In order to form an a-Si film by the above apparatus, the reaction vessel 101 is evacuated by the evacuating means 108 to a high degree of vacuum, and the gas supply means 109 feeds a source gas such as a a silane gas, a disilane gas, a methane gas, or an ethane gas or a doping gas such as a diborane gas to keep the pressure in the reaction vessel 101 in the range of several 10 mTorr to several mTorr. The high-frequency wave power source 106 supplies a high-frequency wave power of 13.56 MHz to the cathode electrode 102 to generate a plasma between the cathode electrode 102 and the film-formed substrate 103, thereby decomposing the source gas. At this time, an a-Si film is deposited on the film-formed substrate 103 heated to about 200° C. to 350° C. by the heater 105.

A deposition rate for obtaining an a-Si film which satisfies the performance of an electrophotographic photosensitive material by the film forming method described above is the maximum of about 6 $\mu$m/hour. When the deposition rate is higher than 6 $\mu$m/hour, the characteristic feature of the photosensitive material cannot be obtained. When the a-Si film is generally used as an electrophotographic photosensitive material, the a-Si film requires a thickness of at least 20 $\mu$m to 30 $\mu$m to obtain charging performance, and a long period of time is required to manufacture an electrophotographic photosensitive material.

In recent years, the report (Plasma Chemistry and Plasma Processing, Vol 7, No. 3, (1987) p.267–p.273) of a plasma CVD method using a parallel-plate-type plasma CVD apparatus and a high-frequency wave power source of 13.56 MHz or higher has been made. This report shows the probability that a deposition rate can be increased without degrading the performance of a deposition film by making a discharge frequency higher than the conventional frequency of 13.56 MHz. An attempt to increase the discharge frequency has been widely examined in sputtering or the like.

The present inventors used the conventional plasma CVD method and apparatus described above and a high-frequency wave power having a frequency higher than a conventional discharge frequency of 13.56 MHz to increase a deposition rate of a high-quality film.

As a result, when the frequency was increased, as an object, a high-quality film could be manufactured at a deposition rate higher than a conventional deposition rate. However, when the discharge frequency of 13.56 MHz was used, the following problem is newly posed. More specifically, when the discharge frequency was increased, a plasma is eccentrically located to make the deposition rate nonuniform. As a result, in a substrate to be processed such as an electrophotographic photosensitive material having a relatively large area, a film thickness nonuniformity (for example, a film thickness nonuniformity of ±20% or more in an electrophotographic photosensitive material) is generated.

Such a film thickness nonuniformity poses a serious problem when not only an electrophotographic photosensitive material but also a crystalline or non-monocrystalline functional deposition film used as an image input line sensor, an image-pickup device, a photomotive device, or the like is formed. In another plasma process such as dry etching or sputtering, when a discharge frequency is increased, similarly, nonuniform processing occurs. For this reason, the high-frequency wave power having a frequency higher than 13.56 MHz cannot be practically used without problems.

SUMMARY OF THE INVENTION

It is an object of the present invention to overcome the above conventional problem and to provide a method and apparatus capable of uniformly performing a plasma process such as CVD, sputtering, etching, or ashing to a substrate having a relatively large area at a process rate which cannot be achieved by a conventional plasma process.

In particular, there is provided a deposition film forming method using plasma CVD which can form a deposition film having an extremely uniform thickness at a high speed, and can efficiently form a semiconductor device.

In order to achieve the above object, according to the present invention, there is provided a plasma processing apparatus in which a counter electrode opposing a cathode electrode is arranged in a reaction vessel which can be reduced in pressure, a high-frequency wave power is applied to the cathode electrode through a matching circuit to generate a plasma between the cathode electrode and the counter electrode, and a plasma process is performed to a substrate to be processed arranged on the counter electrode, characterized in that a plurality of cathode electrodes are arranged outside the reaction vessel, and the reaction vessel arranged between the cathode electrodes and the counter electrode partially consists of a dielectric material.

In the plasma processing apparatus, capacitors are preferably arranged on high-frequency wave transmission paths between the matching circuit and the cathode electrodes, or/and a ground shield covering the reaction vessel arranged outside the cathode electrodes except for the high-frequency wave transmission paths between the matching circuit and the cathode electrodes is preferably arranged. The above apparatus is especially preferable when the high-frequency wave power is 30 MHz to 600 MHz or less.

The plasma processing apparatus is preferable in a case wherein a reaction vessel is cylindrical, and the plurality of cathode electrodes are arranged at equal intervals outside the cylindrical reaction vessel; a case wherein the reaction vessel is cylindrical, and the substrate to be processed and the reaction vessel are arranged on a concentric circle; in a case wherein the plurality of substrates to be processed are arranged on a concentric circle; or in a case wherein the substrate to be processed is flat, and the subject to be processed opposes the plurality of cathode electrodes.

In addition, a plasma processing method for performing a plasma process to a substrate to be processed by using the above plasma processing apparatus belongs to the present invention.

DETAILED DESCRIPTION OF THE PREFERRED EMBODIMENTS

The present inventors examined the above problems on a conventional method and apparatus. As a result, at a discharge frequency higher than a conventional discharge frequency, plasma distribution was sensitive with respect to the shape of a cathode electrode in comparison with the plasma distribution of the conventional apparatus, and the size of a discharge apparatus was $\frac{1}{10}$ or less the wavelength of a high-frequency wave. For this reason, influence of a stationary wave began to occur. As a result, it was found that nonuniform processing occurred.

An experiment performed to solve the above problem and achieve uniformity of a plasma and uniformity of a plasma process based on the plasma, and knowledge obtained by the experiment will be described below.

Figure 13:
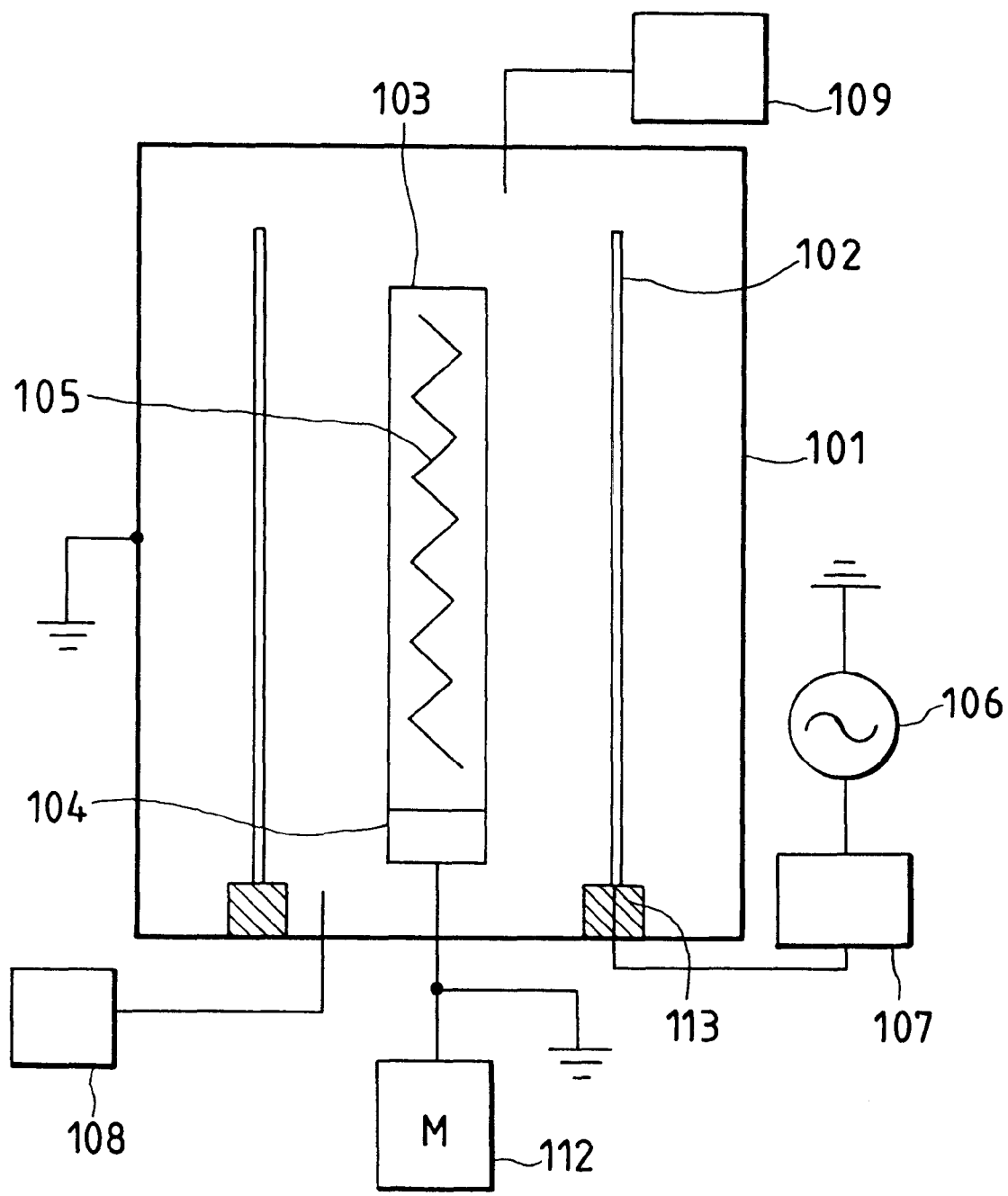
FIG. 13 is a typical view showing a cross-section of a conventional plasma processing apparatus.

By using an apparatus shown in FIG. 13, a high-frequency wave power output a high-frequency wave power source 106 is applied onto a cylindrical cathode electrode 102 through a matching circuit 107 and carried to cause a high-frequency wave electric field between the cathode electrode 102 and a substrate to be processed 103 opposing the cathode electrode 102 to generate a plasma, thereby performing a plasma process onto the substrate to be processed 103. In this case, an electrophotographic photosensitive material serving as a substrate to be process generally has a diameter of about 100 mm. For this reason, the diameter d of the cathode is about 200 mm to 300 mm. When a high-frequency wave is applied from one point of the periphery of the cathode electrode, the transmission distance of the high-frequency wave to the opposite side of the cathode electrode along the peripheral surface is 1.57 d. For example, when d=250 mm, the distance is about 390 mm. When the frequency of the high-frequency wave is changed from 13.56 MHz (conventional frequency) to 100 MHz, a wavelength λ is about 22 m to 3 m in the air. More specifically, at 100 MHz, a high-frequency wave applied from one point on the periphery of the cathode electrode transmits through the cathode electrode peripheral surface to reach the opposite side. When the transmission distance along the peripheral surface is λ/10 or more, an electric field distribution begins to occur on the cathode electrode periphery due to influence of a stationary wave. The high-frequency wave electric field also influences the cathode electrode surface, a nonuniform electric field on the inner periphery of the cathode electrode occurs, and nonuniform discharge occurs in the circumference direction.

Similarly, the length of an electrophotographic photosensitive material serving as a substrate to be processed is generally about 350 mm, so that a cathode electrode length is about 350 mm to 400 mm. For this reason, as in the peripheral direction described above, nonuniform discharge occurs also in an axial direction.

As described above, it was found that, although any problem was not posed at 13.56 MHz or a discharge frequency near 13.56 MHz, nonuniform discharge became conspicuous when the discharge frequency was made higher.

In order to measure a frequency at which these problems are influenced and made conspicuous, discharging was performed at 13.5 MHz to 600 MHz by using the plasma CVD apparatus shown in FIG. 13 to measure plasma density nonuniformity. The plasma density nonuniformity is defined as a value obtained by dividing the difference between the maximum value and minimum value of the plasma density. As a result, the plasma density nonuniformity was ±10% or higher at almost 30 MHz, and it was apparent that nonuniformity of a high-frequency wave voltage on the cathode electrode at the discharge frequency became conspicuous.

When the discharge frequency exceeded 600 MHz, a high-frequency wave matching circuit could not be easily designed, and transmission loss became large. It was understood that the frequency higher than 600 MHz could not be practical.

When the width of energy of ions incident on a substrate to be processed was measured, the width was about 30 eV at 13.56 MHz, about 15 eV at 30 MHz, and about 10 eV at 100 MHz or higher. In the process using incident ion energy for the substrate to be processed, a small energy width is important because controllability can be improved, and the frequency of 30 MHz or higher is-preferably used. Therefore, it is very important that a plasma density is free from nonuniformity in this frequency range.

As a means for solving nonuniformity caused by nonuniform high-frequency wave voltage on the cathode electrode at 30 MHz to 600 MHz, the present inventors obtained the following knowledge.

In order to prevent a high-frequency stationary wave causing high-frequency wave voltage nonuniformity on the cathode electrode from reflecting nonuniformity of plasma strength, the following are required:
  a) to prevent a stationary wave from being generated on the cathode electrode surface
  b) to arrange a buffer function between a stationary wave on the cathode electrode surface and a plasma.

In the apparatus in FIG. 13, in order to supply a high-frequency wave power to a plasma, the high-frequency wave power supplied from a high-frequency wave power source is adjustment in impedance to match the impedance with the impedance of the plasma, and the high-frequency wave power is applied to the rear surface of the cathode electrode. In addition, the high-frequency wave is transmitted from the rear surface of the cathode electrode to the surface peel of the cathode electrode to reach the front surface of the cathode electrode, so that the high-frequency wave power is supplied to the plasma. Here, in order to prevent the high-frequency wave power from being nonuniform on the cathode electrode surface, it is effective that the high-frequency wave distribution transmitted to the rear or front surface of the cathode is adjusted.

In order to adjust the high-frequency wave distribution on the cathode electrode in the above-mentioned manner at a frequency 30 MHz to 600 MHz higher than a conventional frequency, it is important that the complex impedance of the cathode electrode can be adjusted in shape, material, and the like. For this purpose, a reaction vessel must not be constituted by a cathode electrode, or a cathode electrode must not be arranged in a reaction vessel. It is best that a cathode electrode is arranged outside the reaction vessel. In order to supply a high-frequency wave power from the cathode electrode outside the reaction vessel to a plasma in the reaction vessel, a portion between the cathode electrode and the plasma must consist of a dielectric material. In this case, any dielectric material having small loss of a high-frequency wave may be used, e.g., alumina ceramic, quartz glass, pyrex glass, TEFLON, or the like can be used. When such a dielectric material is used as a part of the reaction vessel which can be reduced in pressure, the reaction vessel must have a thickness which can withstand the atmospheric pressure because the reaction vessel is reduced in pressure. Depending on the shape or size, the thickness must be generally set to at least 5 mm or more, preferably, 10 mm or more. When the conventional frequency of 13.56 MHz is used, and a dielectric material having the above thickness is arranged between the cathode electrode and a plasma, a reactance component $1/j\omega C$ of a complex impedance generated by an electrostatic capacitor C of the dielectric material becomes 10Ω to 50Ω which is almost equal to that of the impedance of the plasma, and it is difficult to efficiently supply the high-frequency wave to the plasma. However, when the discharge frequency is increased to 30 MHz to 600 MHz, a complex impedance generated by the dielectric material decreases in inverse proportion to the frequency. For this reason, even if the dielectric material having the above thickness is arranged between the cathode electrode and the plasma, the high-frequency wave can be efficiently supplied to the plasma. As described above, in order to obtain large-area uniform discharge which is problematic at a discharge frequency of 30 MHz or higher, the arrangement in which the cathode electrode is arranged outside the reaction vessel is effective because a high-frequency wave can be efficiently supplied at a discharge frequency of 30 MHz or higher. In this manner, the shape and material of the cathode electrode can be considerably changed, a complex impedance at an arbitrary point on the cathode electrode can be changed, and the above problem can be solved. Although the optimum shape and the optimum constituent material of the cathode electrode change depending on the shape of a substrate to be processed, plasma processing conditions, and a discharge frequency, when the cathode electrode is outside the reaction vessel, only the cathode electrode may be exchanged, and the reaction vessel is not temporarily opened in the air. For this reason, the above method can easily cope with changes in various processing conditions. For the same reason, as described above, the optimum cathode electrode can be determined by trial-and-error more easily than in a conventional method.

Even if a potential distribution is left on the cathode electrode to some extent in the above method, since a dielectric material is arranged between the cathode electrode and a plasma, the uniformity of the plasma is better than that of the potential distribution on the cathode electrode due to the buffer function of the dielectric material.

The above means can be easily executed because the cathode electrode is arranged outside the reaction vessel. However, when the cathode electrode can be arranged outside the reaction vessel as described above, this arrangement can also be easily applied to a parallel-plate-type plasma processing apparatus.

As described above, according to the present invention, a cathode electrode is arranged outside a reaction vessel, and a dielectric material serving as a buffer function is arranged between the cathode electrode and a plasma, a high-frequency stationary wave on the cathode electrode causing high-frequency wave voltage nonuniformity at a frequency of 30 MHz to 600 MHz higher than a conventional frequency is prevented from reflecting nonuniformity of the plasma strength. In addition, in order to eliminate the influence of the stationary wave, it is effective that the high-frequency wave power is separately applied to a plurality of cathode electrodes. This method is optimum in a case wherein the surface area of each cathode is decreased to prevent a stationary wave from easily occurring, and a plasma having a large area is formed. However, in an apparatus in which a high-frequency wave power is supplied from the same power source to a plurality of cathode electrodes through a matching circuit, the distance between the matching circuit and each cathode electrode increases, and L components of the transmission paths between the matching circuit and the cathode electrodes are different from each other. For this reason, in particular, if a frequency is high, matching cannot be established. Therefore, when capacitors are interposed between the matching circuit and the cathode electrodes to change the capacitances of the respective capacitors, L components are canceled, and matching can be established between the plurality of cathode electrodes.

While a high-frequency wave power is transmitted from a high-frequency wave power source to the cathode electrodes through the matching circuit, the high-frequency wave power may be transmitted to the interior of the reaction vessel through the atmospheric air and part of the dielectric material. For this reason, the plasma density becomes nonuniform. As a result, a deposition disadvantageously has a film thickness nonuniformity. Therefore, when a ground shield covering a reaction vessel having a plurality of cathode electrodes arranged outside, except for high-frequency wave transmission paths extending from a matching circuit to the cathode electrodes is arranged, the high-frequency wave power can be prevented from being transmitted to the interior of the reaction vessel through the atmospheric air. As a result, the uniformity of the film thickness can be advantageously improved.

Embodiments of the present invention will be described below with reference to the accompanying drawings.

[First Embodiment]

Figure 1:
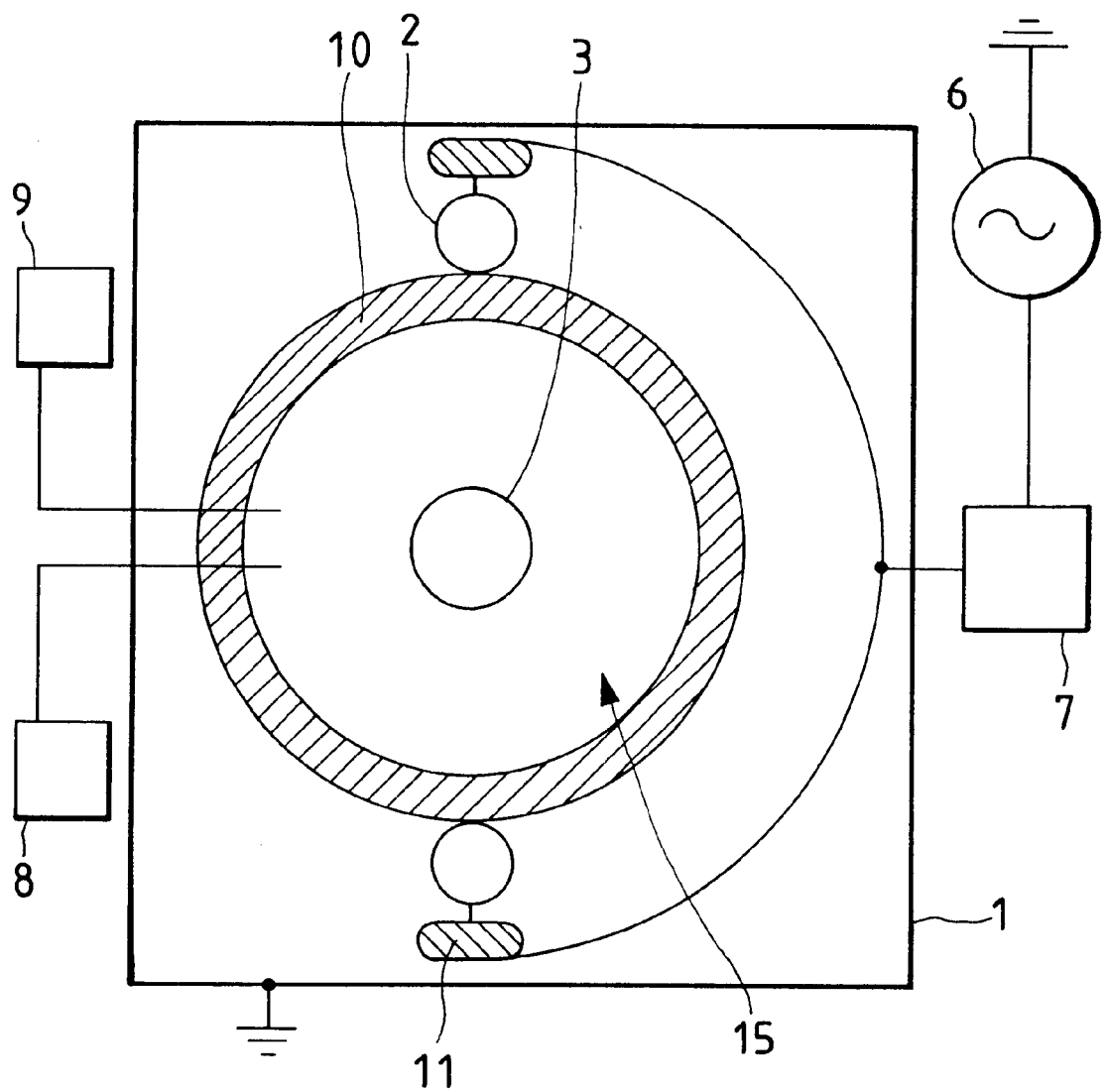
FIG. 1 is a typical view showing the arrangement of a side cross-section of a plasma processing apparatus, in which a capacitor is arranged between a matching circuit and cathode electrodes, according to the first embodiment of the present invention.
Figure 2:
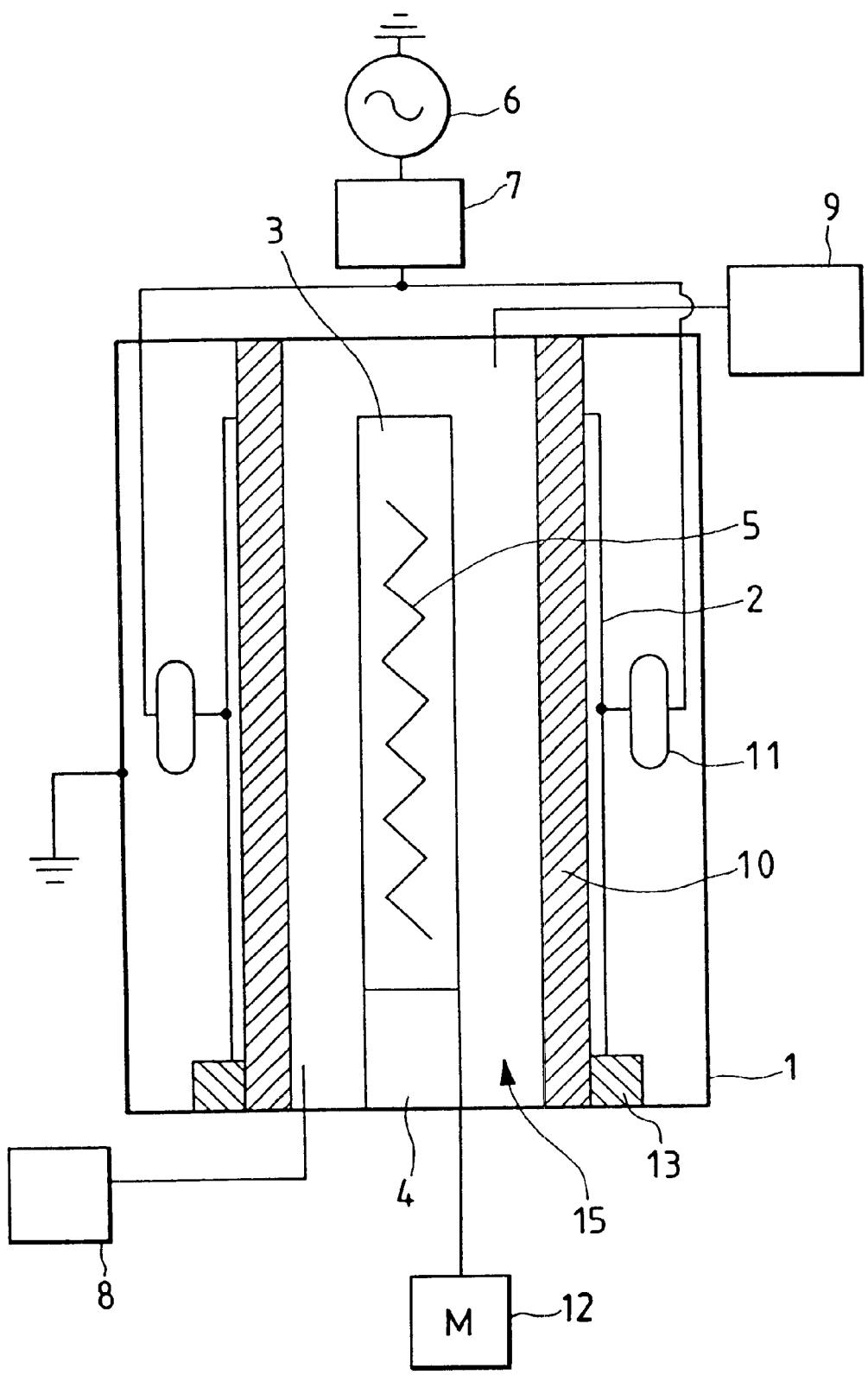
FIG. 2 is a typical view showing the arrangement of a longitudinal cross-section of the plasma processing apparatus, in which a capacitor is arranged between a matching circuit and cathode electrodes, according to the first embodiment of the present invention.

FIG. 1 is a typical view showing the arrangement of a side cross-section of a plasma processing apparatus according to the first embodiment of the present invention, and FIG. 2 is a typical view showing the arrangement of the first embodiment of the present invention.

A plasma processing apparatus according to this embodiment comprises, as shown in FIGS. 1 and 2, a cylindrical dielectric member 10 constituting the side portion of a reaction vessel 15 which can be reduced in pressure, and an earth shield 1, for preventing high-frequency wave leakage, which forms the upper and bottom portions of the reaction vessel 15 and surrounds the side portion of the reaction vessel 15. On the outer peripheral surface (surface on the atmospheric-air side) of the dielectric member 10, cathode electrodes 2 are arranged to be electrically insulated from the earth shield 1 by an insulating material 13. More specifically, the cathode electrodes 2 are arranged outside the reaction vessel 15. Inside the reaction vessel 15 whose side portion is constituted by the dielectric member 10, a cylindrical film-formed substrate 3 serving as a counter electrode of the cathode electrodes 2 is arranged. The film-formed substrate 3 is heated from its inside to a predetermined temperature by a heater 5 arranged in the reaction vessel 15, and is held by a substrate holder 4 having a rotating mechanism driven by a motor 12. The film-formed substrate 3 and the substrate holder 4 for holding the film-formed substrate 3 is grounded, and the film-formed substrate 3 is used as the counter electrode of the cathode electrodes 2. An evacuation means 8 for evacuating the reaction vessel 15 which is partially constituted by the dielectric member 10 and a gas supply means 9 for supplying a gas into the reaction vessel 15 are attached to the plasma processing apparatus.

A matching circuit 7 arranged outside the earth shield 1 is connected to the cathode electrodes 2 through capacitors 11, and a high-frequency wave power source 6 is connected to the matching circuit 7. The capacitances of the capacitors 11 connected between the matching circuit 7 and the cathode electrodes 2 are changed to values which cancel L components of the transmission paths extending from the matching circuit 7 to the cathode electrodes 2.

In order to form an a-Si film for, e.g., a cylindrical electrophotographic photosensitive material by using the above apparatus, after the reaction vessel 15 is evacuated by the evacuation means 8 to a high degree of vacuum, the gas supply means 9 feeds a film-forming source gas such as a silane gas, a disilane gas, a methane gas, or an ethane gas and a doping gas such as a diborane gas to keep the pressure in the reaction vessel 15 in the range of several 10 mTorr to several mTorr. The high-frequency wave power source 6 supplies a high-frequency wave power of 30 MHz to 600 MHz or less to the cathode electrodes 2 through the matching circuit 7 and the capacitor 11 to generate a plasma between the cathode electrodes 2 and the film-formed substrate 3 arranged inside the dielectric member 10, thereby decomposing the source gas. At this time, an a-Si film is uniformly deposited on the film-formed substrate 3 heated to about 200° C. to 350° C. by the heater 5.

As in the above embodiment, matching between paths on which the high-frequency wave power is supplied from the same power source to the plurality of cathode electrodes through the matching circuit can be established. For this reason, when the substrates to be processed are each cylindrical, and the substrates to be processed and the reaction vessel are arranged on a concentric circle, very uniform deposition films can be formed on the plurality of substrates to be processed at a high speed.

Figure 3:
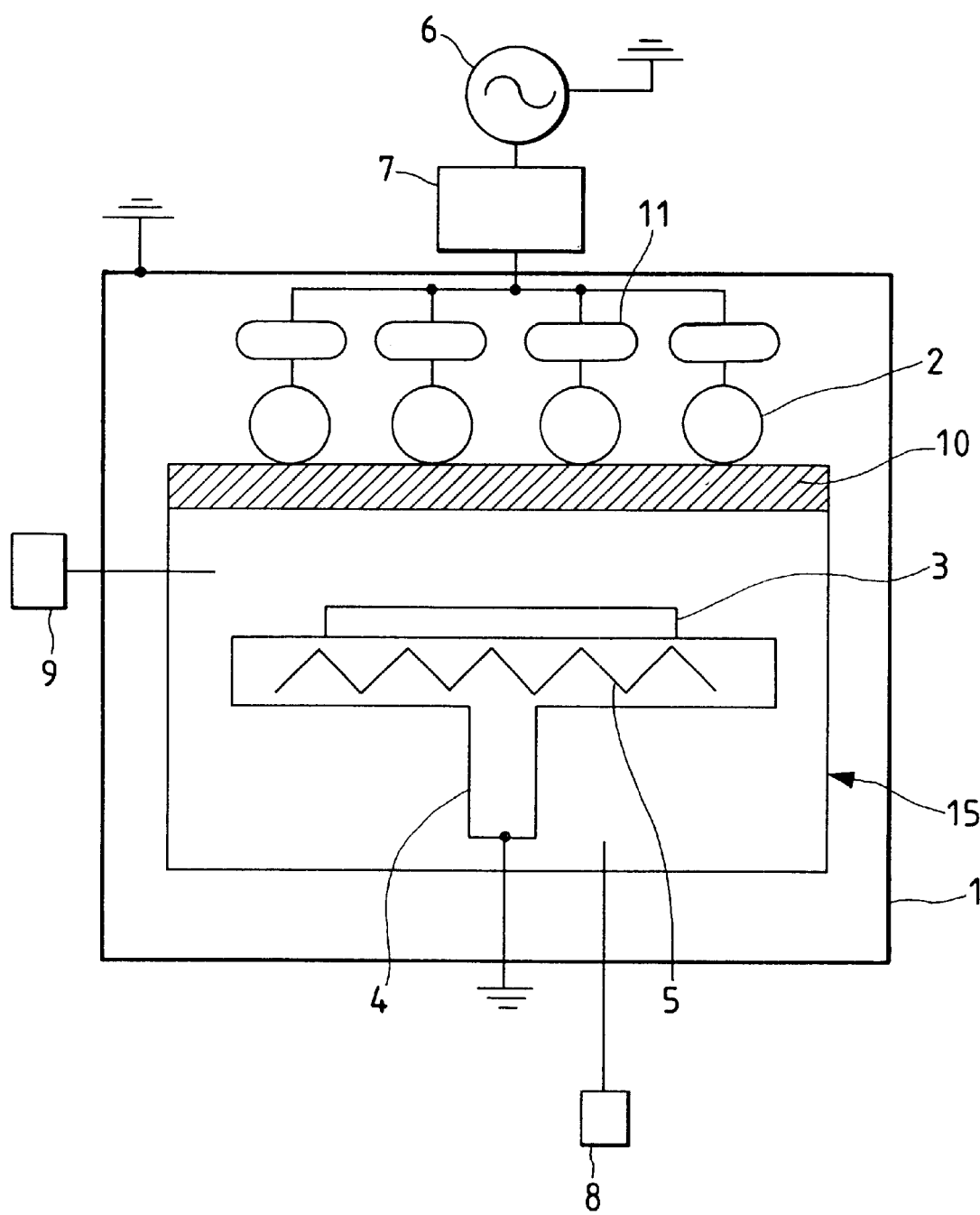
FIG. 3 is a typical view showing a longitudinal cross-section of a plasma processing apparatus according to a modification of the first embodiment of the present invention.

FIG. 3 is a typical view showing a longitudinal cross-section of a plasma processing apparatus according to a modification of the first embodiment of the present invention. The parallel-plate-type plasma processing apparatus shown in FIG. 3 comprises a reaction vessel 15 which has an upper portion constituted by a dielectric member 10 and can be reduced in pressure. The reaction vessel 15 is surrounded by the ground shield 1. A plurality of cathode electrodes 2 are arranged on the outside surface (surface on the atmospheric-air side) of the dielectric member 10. More specifically, the cathode electrodes 2 are arranged outside the reaction vessel 15. Inside the reaction vessel 15 whose upper portion is constituted by the dielectric member 10, a plate-like film-formed substrate 3 serving as a counter electrode of the cathode electrodes 2 is arranged. The film-formed substrate 3 is heated from its inside to a predetermined temperature by a heater 5 arranged in the reaction vessel 15, and is held by a substrate holder 4 having a rotating mechanism driven by a motor 12. The film-formed substrate 3 and the substrate holder 4 for holding the film-formed substrate 3 is grounded. An evacuation means 8 for evacuating the reaction vessel 15 which is partially constituted by the dielectric member 10 and a gas supply means 9 for supplying a gas into the reaction vessel 15 are attached to the plasma processing apparatus.

A matching circuit 7 arranged outside the earth shield 1 is connected to the cathode electrodes 2 through capacitors 11, and a high-frequency wave power source 6 is connected to the matching circuit 7. The capacitances of the capacitors 11 connected between the matching circuit 7 and the cathode electrodes 2 are changed to values which cancel L components of the transmission paths extending from the matching circuit 7 to the cathode electrodes 2.

In such a parallel-plate-type plasma processing apparatus, the same effect as in the above cylindrical coaxial-type plasma processing apparatus and method can be obtained.

These apparatus can be applied to not only CVD but also sputtering, etching, ashing, or the like.

[Second Embodiment]

Figure 4:
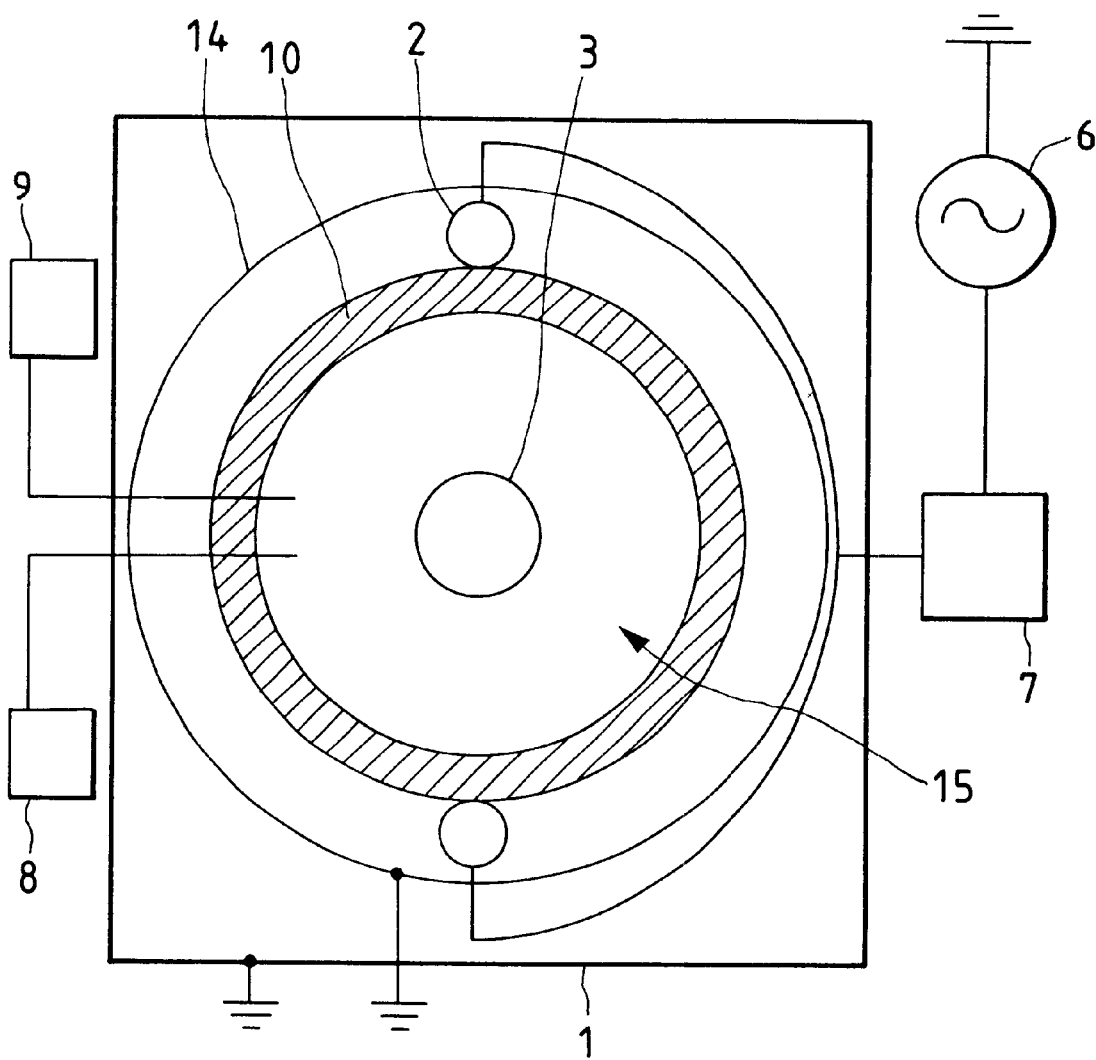
FIG. 4 is a typical view showing the arrangement of a side cross-section of a plasma processing apparatus, having a ground shield covering a reaction vessel to remove a high-frequency wave power source line extending from a matching circuit to a cathode electrode, according to the second embodiment of the present invention.
Figure 5:
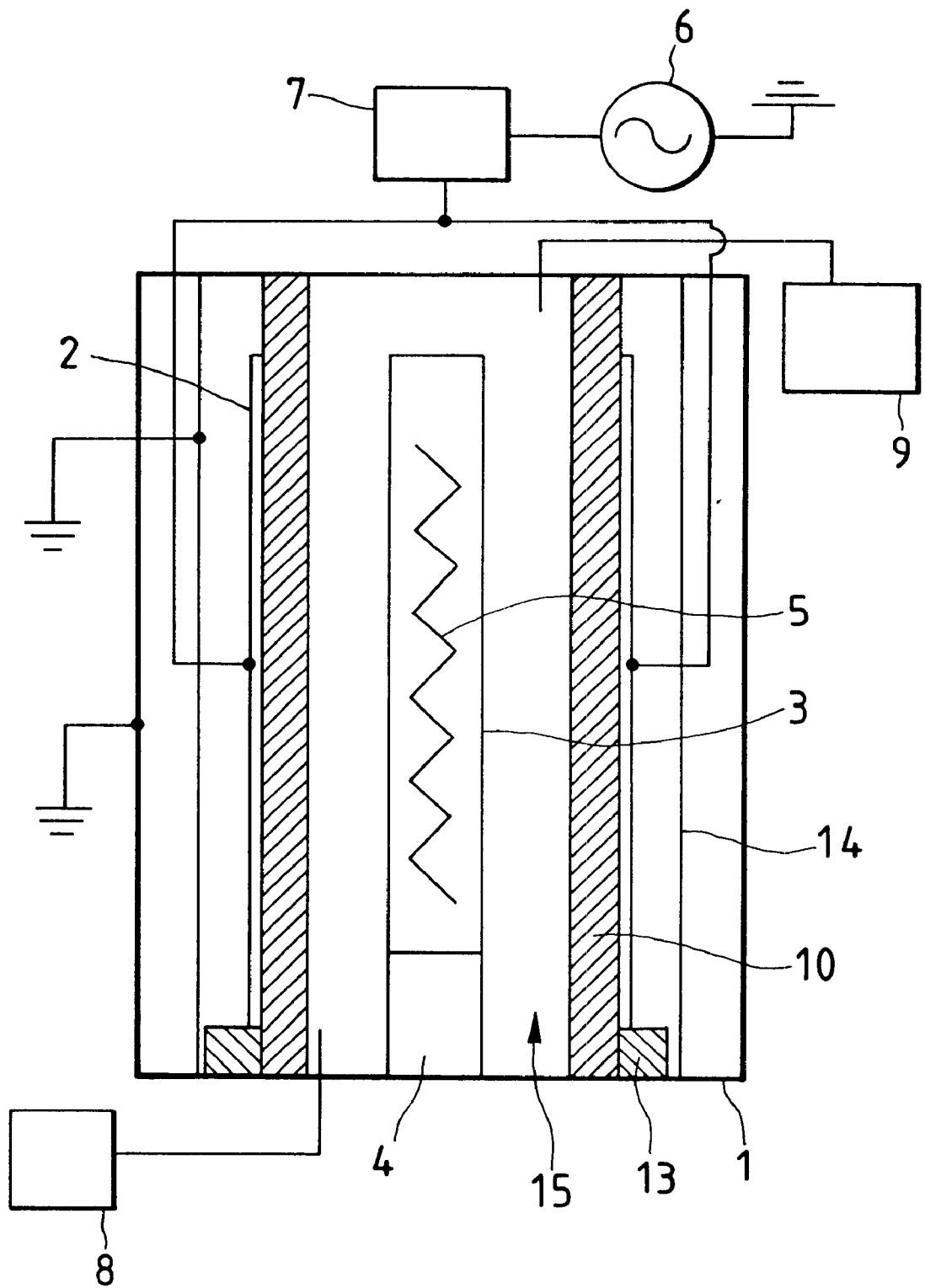
FIG. 5 is a typical view showing the arrangement of a longitudinal cross-section of a plasma processing apparatus, having a ground shield covering a reaction vessel to remove a high-frequency wave power source line extending from a matching circuit to a cathode electrode, according to the second embodiment of the present invention.

FIG. 4 is a typical view showing the arrangement of a side cross-section of a plasma processing apparatus according to the second embodiment of the present invention, and FIG. 5 is a typical view showing the arrangement of a longitudinal cross-section of the second embodiment of the present invention. The same reference numerals as in the first embodiment shown in FIGS. 1 and 2 denote the same parts in FIGS. 4 and 5.

A plasma processing apparatus according to this embodiment comprises, as shown in FIGS. 4 and 5, a cylindrical dielectric member 10 constituting the side portion of a reaction vessel 15 which can be reduced in pressure, and a first ground shield 1, for preventing high-frequency wave leakage, which forms the upper and bottom portions of the reaction vessel 15 and surrounds the side portion of the reaction vessel 15. On the outer peripheral surface (surface on the atmospheric-air side) of the dielectric member 10, cathode electrodes 2 are arranged to be electrically insulated from the first ground shield 1 by an insulating material 13. More specifically, the cathode electrodes 2 are arranged outside the reaction vessel 15. Inside the reaction vessel 15 whose side portion is constituted by the dielectric member 10, a cylindrical film-formed substrate 3 serving as a counter electrode of the cathode electrodes 2 is arranged. The film-formed substrate 3 is heated from its inside to a predetermined temperature by a heater 5 arranged in the reaction vessel 15, and is held by a substrate holder 4 having a rotating mechanism driven by a motor 12. The substrate holder 4 for holding the film-formed substrate 3 is grounded, and the film-formed substrate 3 is used as the counter electrode of the cathode electrodes 2. An evacuation means 8 for evacuating the reaction vessel 15 which is partially constituted by the dielectric member 10 and a gas supply means 9 for supplying a gas into the reaction vessel 15 are attached to the plasma processing apparatus.

A matching circuit 7 arranged outside the first ground shield 1 is connected to the cathode electrodes 2, and a high-frequency wave power source 6 is connected to the matching circuit 7. A second earth shield 14 covering the reaction vessel 15 having the plurality of cathode electrodes 2 arranged outside except for high-frequency wave transmission paths extending from the matching circuit 7 to the cathode electrodes 2 is arranged. A plurality of openings (not shown) for connecting the high-frequency wave transmission paths from the outside of the second ground shield 14 to the cathode electrodes 2 are formed in the second ground shield 14.

As in the above embodiment, the reaction vessel having a plurality of cathode electrodes arranged outside is covered with the ground shields outside the high-frequency wave transmission paths extending from the matching circuit to the cathode electrodes, so that the high-frequency wave power can be prevented from being transmitted to the interior of the reaction vessel through the atmospheric air. For this reason, when the substrates to be processed are each cylindrical, and the substrates to be processed and the reaction vessel are arranged on a concentric circle, very uniform deposition films can be formed on a plurality of substrates to be processed at a high speed.

Figure 6:
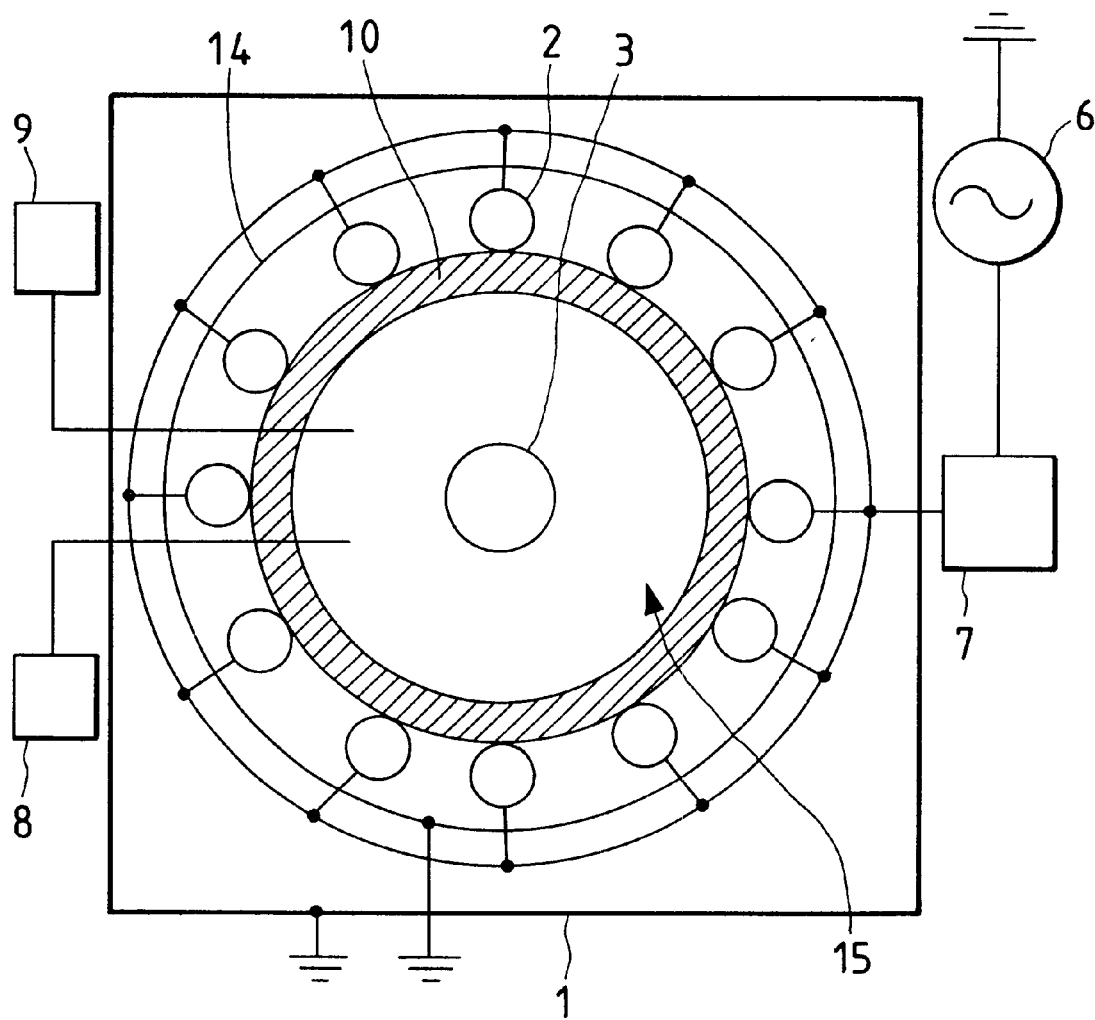
FIG. 6 is a typical view showing a state in which cathode electrodes shown in FIG. 4 are arranged on a concentric circle.

As shown in FIG. 4, the number of cathode electrodes is not limited to two, and, as shown in FIG. 6, a plurality of cathode electrodes are preferably arranged to prevent a high-frequency stationary wave from easily occurring and to make the plasma distribution more uniform.

The present invention is not limited to the cylindrical coaxial-type plasma processing apparatus and method, and the present is also preferable for a parallel-plate-type plasma processing apparatus and method.

Figure 7:
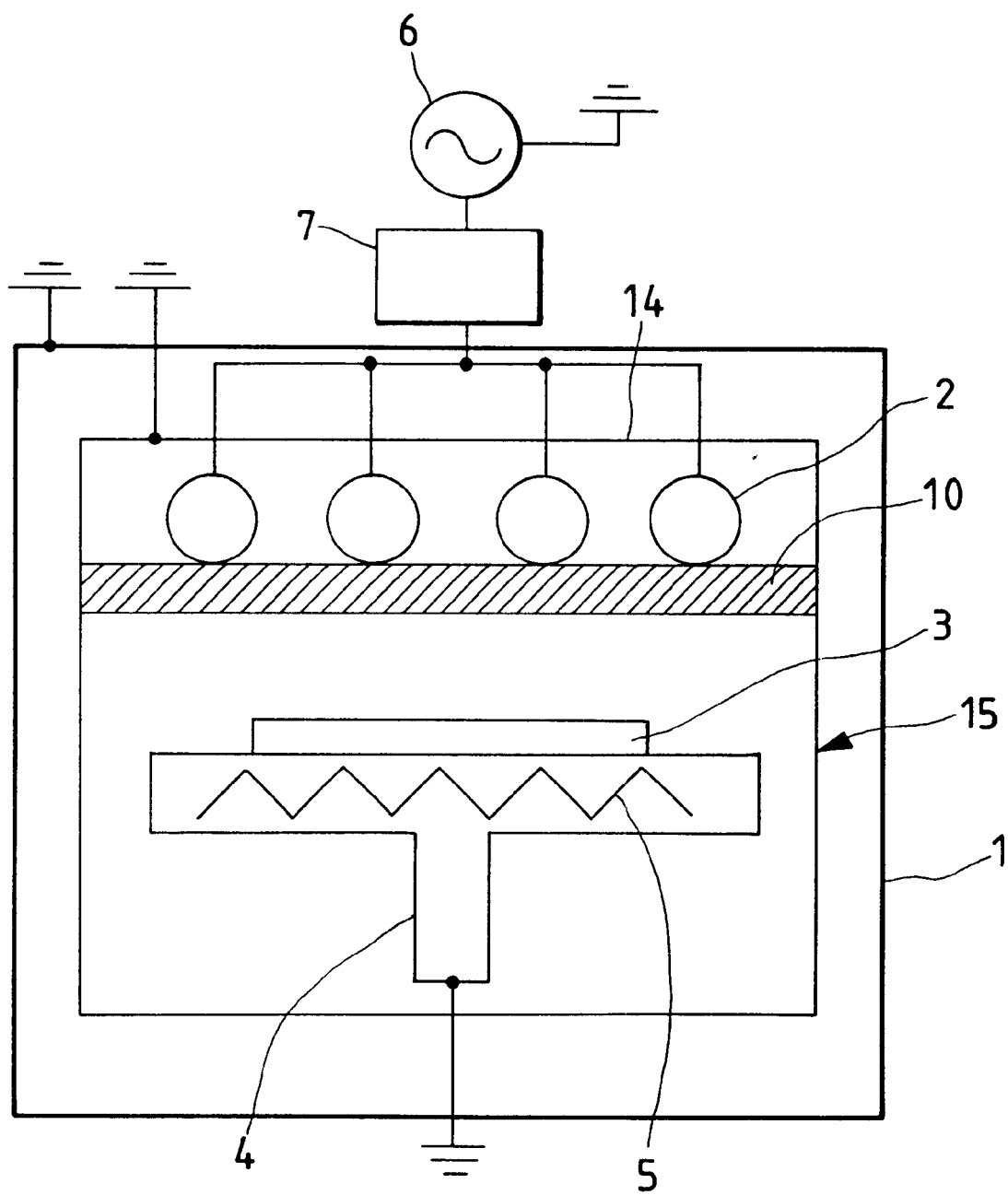
FIG. 7 is a typical view showing a longitudinal cross-section of a plasma processing apparatus according to a modification of the second embodiment of the present invention.

FIG. 7 is a typical view showing a longitudinal cross-section of a plasma processing apparatus according to a modification of the second embodiment of the present invention. The same reference numerals as in the first embodiment shown in FIGS. 1 and 2 denote the same parts in FIG. 7. A parallel-plate-type plasma processing apparatus as shown in FIG. 7 comprises a reaction vessel 15 whose upper portion is constituted by a dielectric member 10 and which can be reduced in pressure. The reaction vessel 15 is surrounded by a ground shield 1. A plurality of cathode electrodes 2 are arranged on the outside surface (surface on the atmospheric-air side) of the dielectric member 10. More specifically, the cathode electrodes 2 are arranged outside the reaction vessel 15. Inside the reaction vessel 15 whose upper portion is constituted by the dielectric member 10, a plate-like film-formed substrate 3 serving as a counter electrode of the cathode electrodes 2 is arranged. The film-formed substrate 3 is heated from its inside to a predetermined temperature by a heater 5 arranged in the reaction vessel 15, and is held by a substrate holder 4 having a rotating mechanism driven by a motor 12. The film-formed substrate 3 and the substrate holder 4 for holding the film-formed substrate 3 is grounded, and the film-formed substrate 3 is used as the counter electrode of the cathode electrodes 2. An evacuation means (not shown) for evacuating the reaction vessel 15 which is partially constituted by the dielectric member 10 and a gas supply means (not shown) for supplying a gas into the reaction vessel 15 are attached to the plasma processing apparatus.

A matching circuit 7 arranged outside the first ground shield 1 is connected to the cathode electrodes 2, and a high-frequency wave power source 6 is connected to the matching circuit 7. A second ground shield 14 covering the reaction vessel 15 having the plurality of cathode electrodes 2 arranged outside except for high-frequency wave transmission paths extending from the matching circuit 7 to the cathode electrodes 2 are arranged. A plurality of openings (not shown) for connecting the high-frequency wave transmission paths from the outside of the second ground shield 14 to the cathode electrodes 2 are formed in the second ground shield 14.

In such a parallel-plate-type plasma processing apparatus, the same effect as in the above cylindrical coaxial-type plasma processing apparatus and method can be obtained.

[Third Embodiment]

Figure 8:
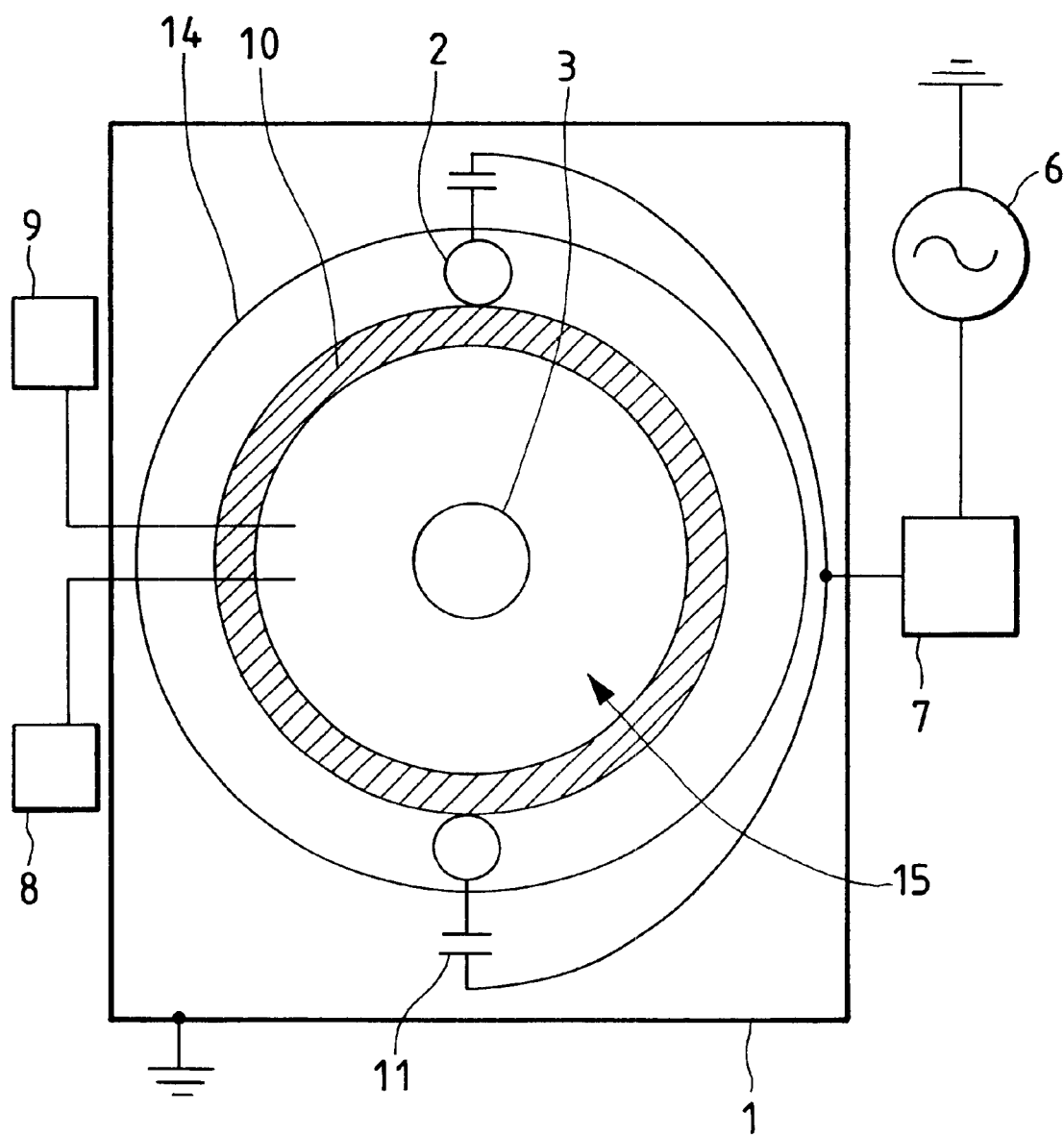
FIG. 8 is a typical view showing the arrangement of a side cross-section of a plasma processing apparatus, having a capacitor arranged between a matching circuit and a cathode electrode and having a ground shield covering a reaction vessel to remove a high-frequency wave power source line extending from the matching circuit to the cathode electrode, according to the third embodiment of the present invention.
Figure 9:
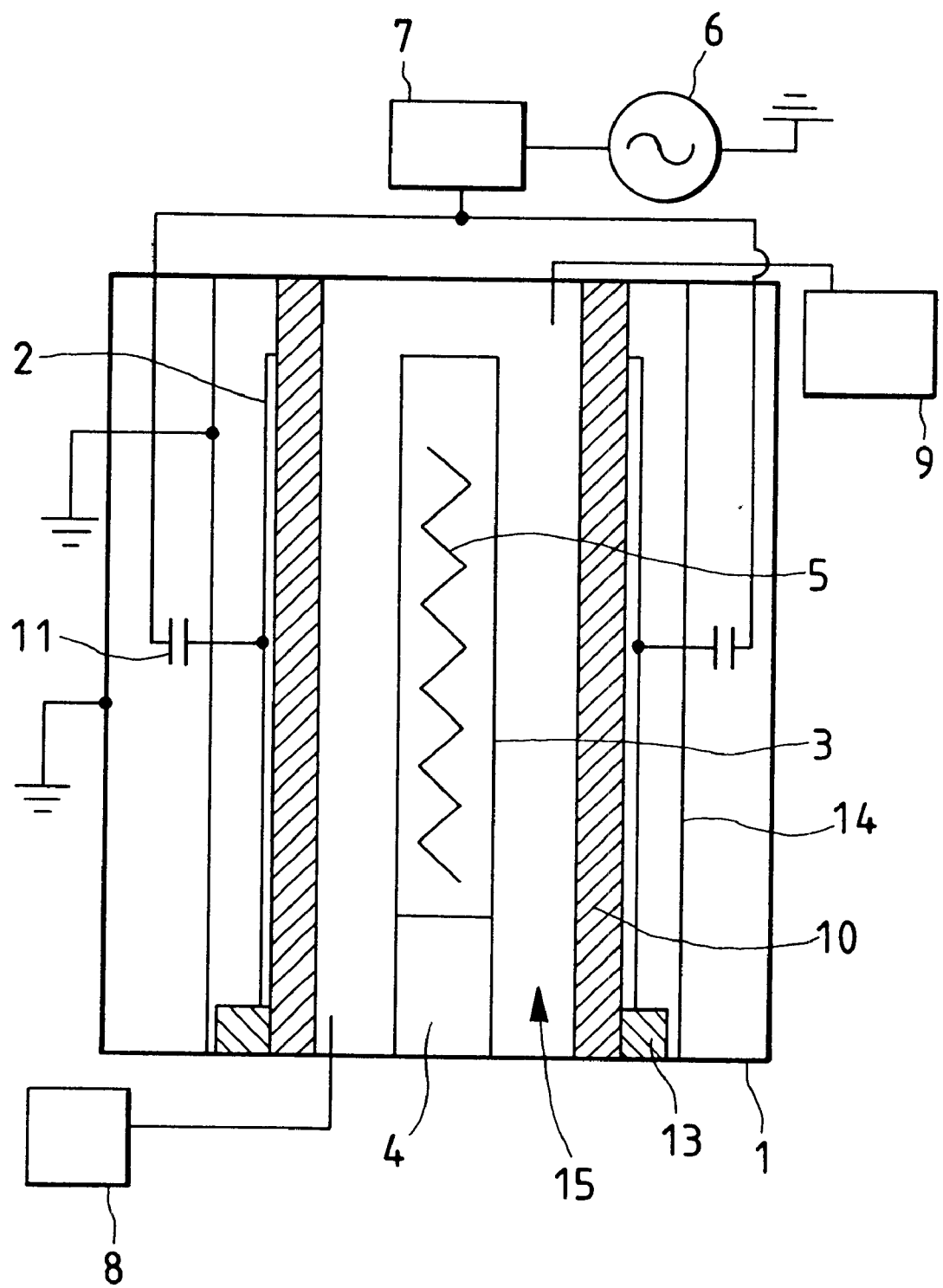
FIG. 9 is a typical view showing the arrangement of a longitudinal cross-section of the plasma processing apparatus, having a capacitor arranged between a matching circuit and a cathode electrode and having a ground shield covering a reaction vessel to remove a high-frequency wave power source line extending from the matching circuit to the cathode electrode, according to the third embodiment of the present invention.

FIG. 8 is a typical view showing the arrangement of a side cross-section of a plasma processing apparatus according to the third embodiment of the present invention, and FIG. 9 is a typical view showing the arrangement of a longitudinal cross-section of the third embodiment of the present invention. The same reference numerals as in the first and second embodiment shown in FIGS. 1 to 7 denote the same parts in FIGS. 8 and 9.

A plasma processing apparatus according to this embodiment comprises, as shown in FIGS. 8 and 9, a cylindrical dielectric member 10 constituting the side portion of a reaction vessel 15 which can be reduced in pressure, and a first ground shield 1, for preventing high-frequency wave leakage, which forms the upper and bottom portions of the reaction vessel 15 and surrounds the side portion of the reaction vessel 15. On the outer peripheral surface (surface on the atmospheric-air side) of the dielectric member 10, cathode electrodes 2 are arranged to be electrically insulated from the first earth shield 1 by an insulating material 13. More specifically, the cathode electrodes 2 are arranged outside the reaction vessel 15. Inside the reaction vessel 15 whose side portion is constituted by the dielectric member 10, a cylindrical film-formed substrate 3 serving as a counter electrode of the cathode electrodes 2 is arranged. The film-formed substrate 3 is heated from its inside to a predetermined temperature by a heater 5 arranged in the reaction vessel 15, and is held by a substrate holder 4 having a rotating mechanism driven by a motor 12. The substrate holder 4 for holding the film-formed substrate 3 is grounded, and the film-formed substrate 3 is used as the counter electrode of the cathode electrodes 2. A matching circuit 7 arranged outside the first ground shield 1 is connected to the cathode electrodes 2 through capacitors, and a high-frequency wave power source 6 is connected to the matching circuit 7. An evacuation means 8 for evacuating the reaction vessel 15 which is partially constituted by the dielectric member 10 and a gas supply means 9 for supplying a gas into the reaction vessel 15 are attached to the plasma processing apparatus.

The capacitances of the capacitors 11 connected between the matching circuit 7 and the cathode electrodes 2 are changed to values which cancel L components of the transmission paths extending from the matching circuit 7 to the cathode electrodes 2. A second ground shield 14 covering the reaction vessel 15 having the plurality of cathode electrodes 2 arranged outside except for high-frequency wave transmission paths extending from the matching circuit 7 to the cathode electrodes 2 is arranged. A plurality of openings (not shown) for connecting the high-frequency wave transmission paths from the outside of the second ground shield 14 to the cathode electrodes 2 are formed in the second ground shield 14.

As in the above embodiment, matching between paths on which the high-frequency wave power is supplied from the same power source to the plurality of cathode electrodes through the matching circuit can be established, and the reaction vessel having a plurality of cathode electrodes arranged outside is covered with the ground shields outside the high-frequency wave transmission paths extending from the matching circuit to the cathode electrodes, so that the high-frequency wave power can be prevented from being transmitted to the interior of the reaction vessel through the atmospheric air. For this reason, when the substrates to be processed are each cylindrical, and the substrates to be processed and the reaction vessel are arranged on a concentric circle, very uniform deposition films can be formed on the plurality of substrates to be processed at a high speed.

Figure 10:
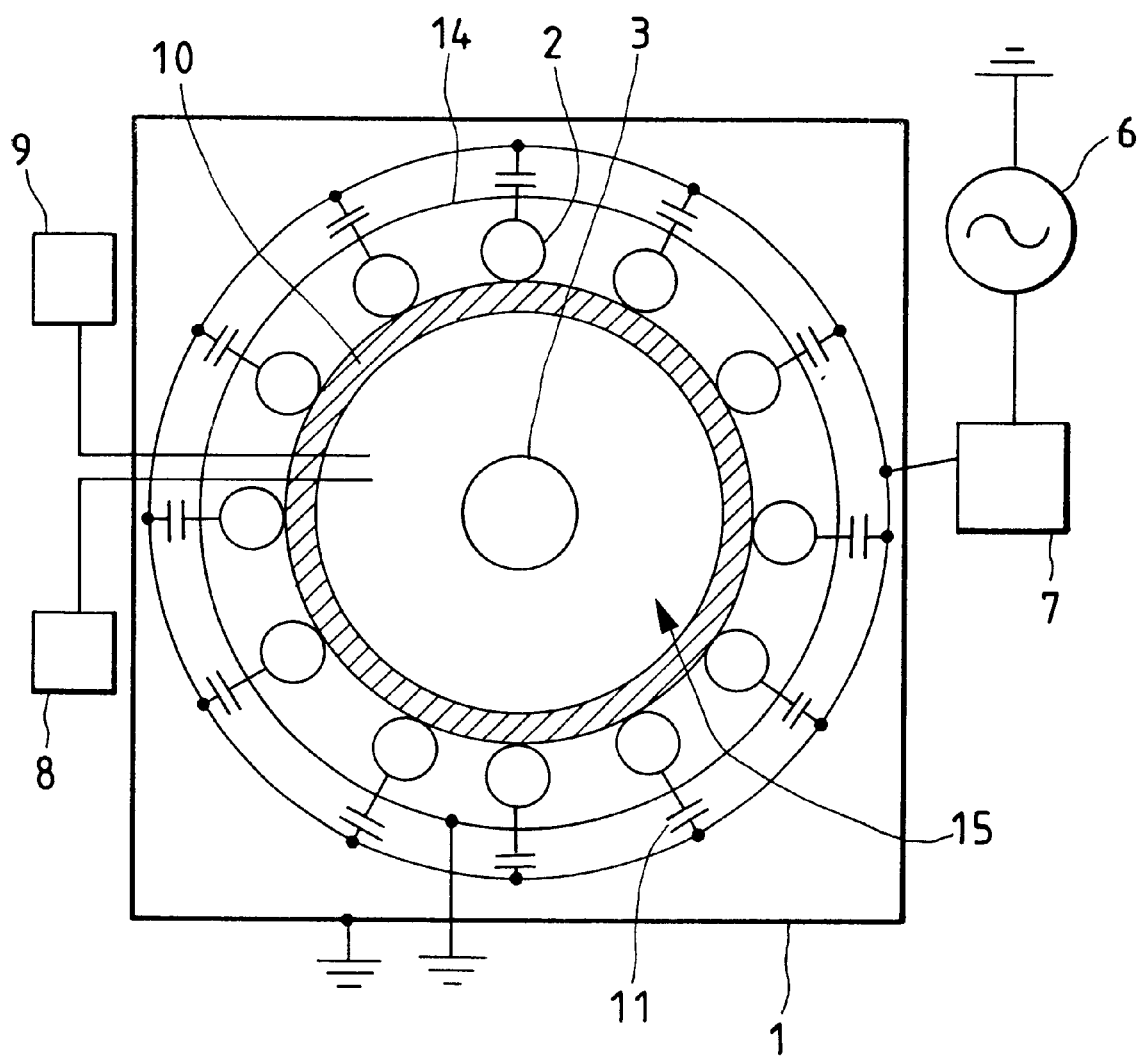
FIG. 10 is a typical view showing a state wherein a large number of cathode electrodes shown in FIG. 7 are arranged on a concentric circle.
Figure 11:
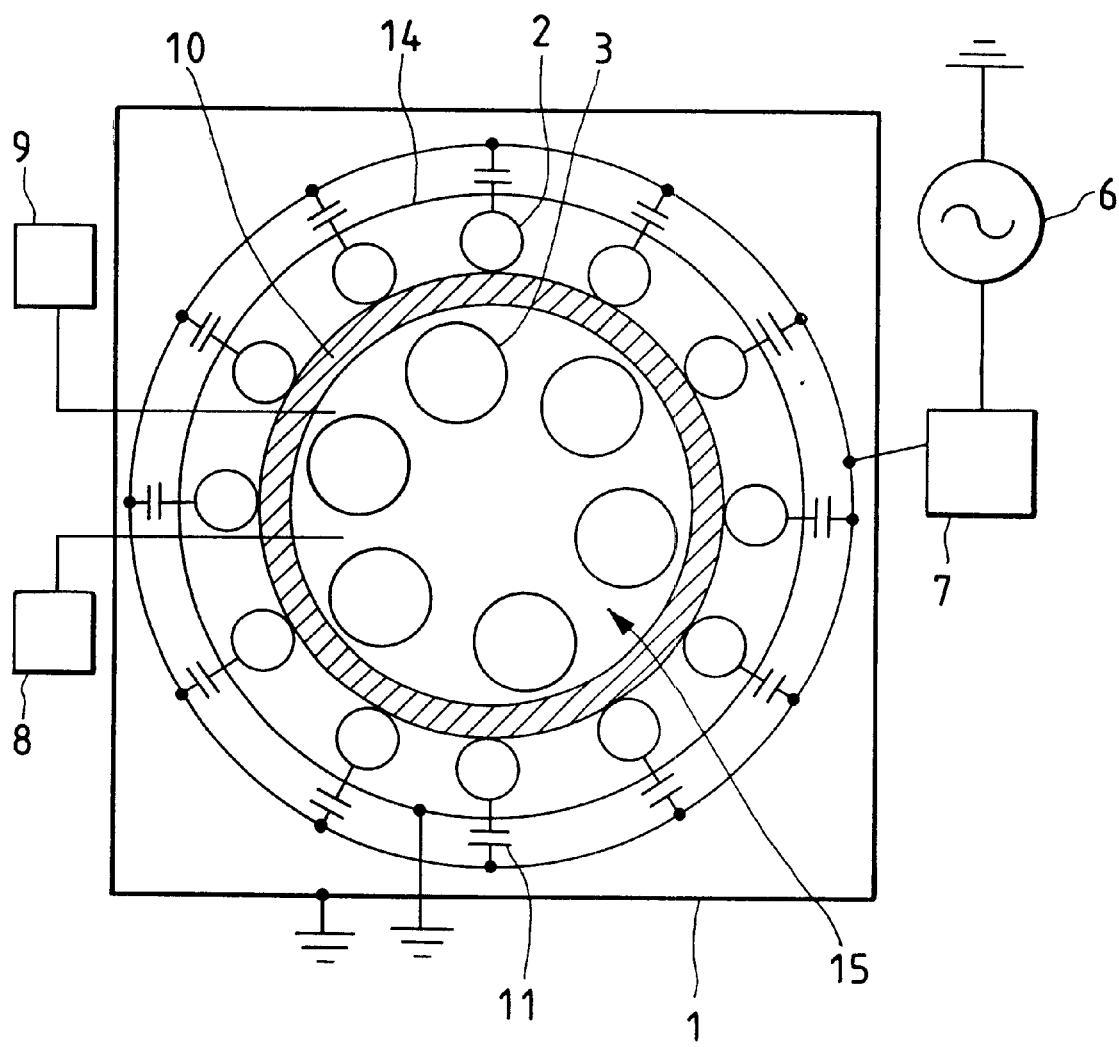
FIG. 11 is a typical view showing a state wherein substrates to be processed shown in FIG. 10 are arranged on a concentric circle.

As shown in FIG. 8, the number of cathode electrodes is not limited to two, and, as shown in FIG. 10, a plurality of cathode electrodes are preferably arranged to prevent a high-frequency stationary wave from easily occurring and to make the plasma distribution more uniform. Even if the plurality of film-formed substrates 3 are arranged on a concentric circle as shown in FIG. 11, a nonuniform film is rarely formed.

Figure 12:
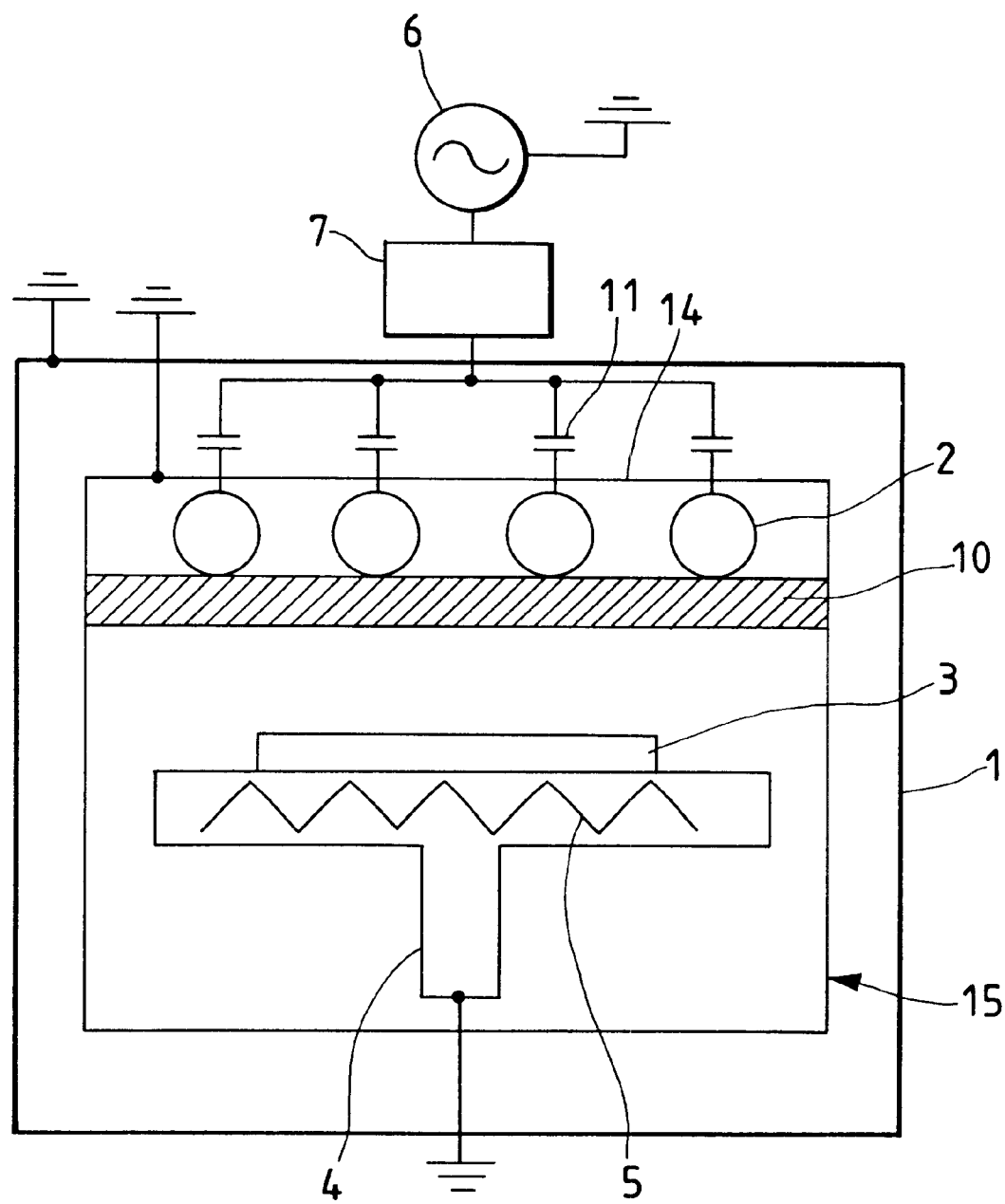
FIG. 12 is a typical view showing a longitudinal cross-section of a plasma processing apparatus according to a modification of the third embodiment of the present invention.

FIG. 12 is a typical view showing a longitudinal cross-section of a plasma processing apparatus according to a modification of the third embodiment of the present invention. The same reference numerals as in the first and second embodiments shown in FIGS. 1 to 7 denote the same parts in FIG. 12. A parallel-plate-type plasma processing apparatus as shown in FIG. 12 comprises a reaction vessel 15 whose upper portion is constituted by a dielectric member 10 and which can be reduced in pressure. The reaction vessel 15 is surrounded by a ground shield 1. A plurality of cathode electrodes 2 are arranged on the outside surface (surface on the atmospheric-air side) of the dielectric member 10. More specifically, the cathode electrodes 2 are arranged outside the reaction vessel 15. Inside the reaction vessel 15 whose upper portion is constituted by the dielectric member 10, a plate-like film-formed substrate 3 serving as a counter electrode of the cathode electrodes 2 is arranged. The film-formed substrate 3 is heated from its inside to a predetermined temperature by a heater 5 arranged in the reaction vessel 15, and is held by a substrate holder 4 having a rotating mechanism driven by a motor 12. The substrate holder 4 for holding the film-formed substrate 3 is grounded, and the film-formed substrate 3 is used as the counter electrode of the cathode electrodes 2. An evacuation means (not shown) for evacuating the reaction vessel 15 which is partially constituted by the dielectric member 10 and a gas supply means (not shown) for supplying a gas into the reaction vessel 15 are attached to the plasma processing apparatus.

A matching circuit 7 arranged outside the first ground shield 1 is connected to the cathode electrodes 2 through capacitors 11, and a high-frequency wave power source 6 is connected to the matching circuit 7. The capacitances of the capacitors 11 connected between the matching circuit 7 and the cathode electrodes 2 are changed to values which cancel L components of the transmission paths extending from the matching circuit 7 to the cathode electrodes 2.

A second earth shield 14 covering the reaction vessel 15 having the plurality of cathode electrodes 2 arranged thereoutside except for high-frequency wave transmission paths extending from the matching circuit 7 to the cathode electrodes 2 is arranged. A plurality of openings (not shown) for connecting the high-frequency wave transmission paths from the outside of the second ground shield 14 to the cathode electrodes 2 are formed in the second ground shield 14.

In such a parallel-plate-type plasma processing apparatus, the same effect as in the above cylindrical coaxial-type plasma processing apparatus and method can be obtained.

EXAMPLES

The above embodiments will be further described below with reference to detailed examples and comparative examples. The present invention is not limited to these examples.

Example 1

In this example, by using the cylindrical coaxial-type plasma CVD apparatus shown in FIGS. 1 and 2, an a-Si film was formed on a film-formed substrate at a discharge frequency of 100 MHz under the film-formation conditions shown in Table 1.

TABLE 1

| Source gas | $SiH_4$ |
|---|---|
| Carrier Gas | $H_2$ |
| Gas flow rate $SiH_4$ | 350 sccm |
| $H_2$ | 350 sccm |
| Pressure | 0.03 torr |
| Substrate temperature | 250° C. |
| High-frequency wave power | 0.5 W/cm$^2$ |

As a cathode electrode, a simply circular Al cathode electrode having an inner diameter of 250 mm and a length of 300 mm was used. The cathode electrode was arranged outside an alumina-ceramic dielectric tube which partially constituted a reaction vessel and had a thickness of 10 mm.

Film thickness nonuniformity was obtained when film formation was performed by using the externally arranged cathode electrodes. For comparison, a comparison experiment for a film thickness nonuniformity obtained in a case wherein simply cylindrical Al cathode electrodes having an inner diameter of 250 mm and a length of 300 mm was arranged in a reaction vessel was performed. As a result, the film thickness nonuniformities were about ±15% in use of the externally arranged cathode electrodes and about ±30% in use of the simply circular cathode. An effect of improving a film thickness distribution obtained by using the externally arranged cathode electrodes could be confirmed.

The respective films were considerably influenced by plasma distribution. When the film quality of an a-Si film was partially measured in the same film thickness state, the a-Si film could be sufficient in practical use, e.g., in an electrophotographic photosensitive device, an image input line sensor, or the like.

When the cathode electrodes are arranged outside the reaction vessel as described above, a high-frequency wave power is supplied to a plasma through a dielectric member partially constituting the reaction vessel which can be reduced in pressure, the potential distribution-of a high-frequency wave on the cathode electrode. As a result, a problem of film thickness nonuniformity caused by a high discharge frequency can be solved.

Example 2

In this example, in the plasma processing apparatus shown in FIGS. 1 and 2, the high-frequency wave power source 6 having a frequency of 105 MHz was used, and a discharge experiment was performed under the conditions shown in Table 1 of Example 1. In this example, a reactance L between a matching circuit and a load was set to 404.5 nH, and a high-power capacitor was arranged as shown in FIG. 1. The obtained results are shown in Table 2.

TABLE 2

| Capacitance of Capacitor | Incident Wave | Reflection Wave | Synthesis L between Matching Circuit and Cathode Electrode | Discharge State |
|---|---|---|---|---|
| 1 pF | 500 W | 300 W | 129 Ω | discharge may occur |
| 5 pF | 500 W | 80 W | 36.4 Ω | almost stable |
| 7 pF | 500 W | 5 W | 14.1 Ω | stable |
| 10 pF | 500 W | 200 W | 115.2 Ω | slightly stable |

In this manner, when capacitors are interposed between the matching circuit and the cathode electrodes, and the capacitances of the capacitors are changed, an L component is canceled. A problem that matching cannot be established can be solved.

Example 3

In this example, by using the parallel-plate-type plasma CVD apparatus shown in FIG. 3, an a-Si film was formed on the film-formed substrate at a discharge frequency of 100 MHz under the film-formation conditions shown in Table 3.

TABLE 3

| Source gas | $SiH_4$ |
|---|---|
| Carrier Gas | $H_2$ |
| Gas flow rate $SiH_4$ | 450 sccm |
| $H_2$ | 450 sccm |
| Pressure | 0.03 torr |
| Substrate temperature | 250° C. |
| High-frequency wave power | 0.5 W/cm$^2$ |

In this example, a rectangular substrate to be processed was used. Capacitors were interposed between a matching circuit and cathode electrodes, and the cathode electrodes were arranged outside an alumina-ceramic dielectric rectangular member which partially constituted a reaction vessel and had a thickness of 20 mm. For comparison, a film thickness nonuniformity obtained when cathode electrodes were arranged inside a reaction vessel to perform film formation under the conditions shown in Table 3 was measured. When the cathode electrodes were arranged outside the reaction vessel, and the capacitors were interposed, a film thickness nonuniformity was about ±18%; when the cathode electrodes were arranged inside the reaction vessel, a film thickness nonuniformity was about ±35%.

The respective films were considerably influenced by only a plasma distribution. When the film quality of an a-Si film was partially measured in the same film thickness state, the a-Si film could be sufficient in practical use, e.g., in an electrophotographic photosensitive device, an image input line sensor, or the like.

Example 4

In this example, by using a cylindrical coaxial-type plasma CVD apparatus in which a second ground shield covering a reaction vessel having the plurality of cathode electrodes 2 arranged outside except for high-frequency wave transmission paths extending from a matching circuit to the cathode electrodes as shown in FIGS. 4 and 5 was arranged, an a-Si film was formed on the film-formed substrate at a discharge frequency of 100 MHz under the film-formation conditions shown in Table 1. For comparison, by using an apparatus in which the second ground shield was not used, an a-Si film was formed on a film-formed substrate under the film-formation conditions shown in Table 1.

A film thickness nonuniformity obtained when a film forming apparatus having the second ground shield was measured. As a result, the film thickness nonuniformity was about ±11%. When the second ground shield was not used, the film thickness nonuniformity was about ±15%. It was confirmed that an effect of improving a film thickness distribution was obtained by using the second ground shield.

The respective films were considerably influenced by plasma distribution. When the film quality of an a-Si film was partially measured in the same film thickness state, the a-Si film could be sufficient in practical use, e.g., in an electrophotographic photosensitive device, an image input line sensor, or the like.

As described above, by arranging the second earth shield covering a reaction vessel having the plurality of cathode electrodes arranged thereoutside except for high-frequency wave transmission paths extending from the matching circuit to the cathode electrodes, a complex impedance at a high frequency can be increased. When the arrangement is designed such that only a portion of the high-frequency path free from the earth shield can be controlled, a problem of film thickness nonuniformity caused by a high discharge frequency can be solved.

Example 5

In this example, by using the plasma CVD apparatus in which cathode electrodes were arranged on a concentric circle shown in FIG. 6, an a-Si film was formed on the film-formed substrate at a discharge frequency of 100 MHz under the film-formation conditions shown in Table 1.

As a result, when the cathodes were arranged on the concentric circle, an apparatus which had the second ground shield according to the present invention and cathode electrodes arranged on a concentric circle could obtain a high film formation rate of 4 nm/s.

Example 6

In this example, as shown in FIG. 7, by using a parallel-plate-type-plasma CVD apparatus in which a second ground shield covering a reaction vessel having the plurality of cathode electrodes arranged thereoutside except for high-frequency wave transmission paths extending from a matching circuit to the cathode electrodes, an a-Si film was formed on the film-formed substrate at a discharge frequency of 100 MHz under the film-formation conditions shown in Table 3.

A film thickness nonuniformity was measured by using an apparatus in which the second ground shield was arranged. As a result, the film thickness nonuniformity was about ±13% in comparison with about ±18% obtained by using a simple plate, and preferable film thickness uniformity was exhibited.

The respective films were considerably influenced by only a plasma distribution. When the film quality of an a-Si film was partially measured in the same film thickness state, the a-Si film could be sufficient in practical use, e.g., in an electrophotographic photosensitive device, an image input line sensor, or the like.

Example 7

In this example 7, by using the cylindrical coaxial-type plasma CVD apparatus shown in FIGS. 8 and 9, an a-Si film was formed on a film-formed substrate at a discharge frequency of 100 MHz under the film-formation conditions shown in Table 1.

As cathode electrodes, simply cylindrical Al cathode electrodes each having an inner diameter of 250 mm and a length of 300 mm was used. The cathode electrodes were arranged outside an alumina-ceramic dielectric tube which partially constituted a reaction vessel and had a thickness of 10 mm. A second ground shield covering the reaction vessel having the plurality of cathode electrodes arranged outside except for high-frequency wave transmission paths extending from the matching circuit to the cathode electrodes was arranged. When film-formation conditions changed, the cathode length had to be changed depending on the conditions. The cathode length was not limited to the value in this example.

A film thickness nonuniformity obtained when film formation was performed by using the externally arranged cathode electrode. For comparison, comparison experiments for film thickness nonuniformities obtained in a case wherein simply cylindrical Al cathode electrodes each having a length of 300 mm was arranged in a reaction vessel was performed; a case wherein externally arranged cathodes shown in FIG. 1 were used, and capacitors were interposed between a matching circuit and the cathodes; and a case wherein a second ground shield covering the reaction vessel having the plurality of cathode electrodes arranged thereoutside except for high-frequency wave transmission paths extending from the matching circuit to the cathode electrodes was arranged was made. As a result, the film thickness nonuniformity was about ±15% when cylindrical cathode electrodes was arranged in a reaction vessel; ±13% when the capacitors were interposed; ±11% when the second ground shield was interposed; and ±9% when the apparatus using the capacitors and the second/ground shield was used. An effect of improving a film thickness distribution could be confirmed.

The respective films were considerably influenced by only plasma distribution. When the film quality of an a-Si film was partially measured in the same film thickness state, the a-Si film could be sufficient in practical use, e.g., in an electrophotographic photosensitive device, an image input line sensor, or the like.

As described above, the capacitors are arranged to the cathode electrodes, the second ground shield covering the reaction vessel having the plurality of cathode electrodes arranged thereoutside except for high-frequency wave transmission paths extending from the matching circuit to the cathode electrodes, and a high-frequency wave is supplied to a plasma through the dielectric member partially constituting the reaction chamber which can be reduced in pressure. For this reason, matching can be established, and loss caused by transmission of the high-frequency wave power through the atmospheric air before the high-frequency wave power reaches the cathode electrodes is maximally prevented, so that the plasma is stable. As a result, a problem of film thickness nonuniformity can be solved.

Example 8

In this example, as shown in FIG. 10, by using a plasma CVD apparatus having a plurality of cathode electrodes arranged on a concentric circle, an a-Si film was formed on the film-formed substrate at a discharge frequency of 100 MHz under the film-formation conditions shown in Table 1.

As a result, when the cathodes were arranged on the concentric circle, an apparatus which had the second ground shield according to the present invention, cathode electrodes arranged on a concentric circle, and capacitors arranged to the respective cathode electrodes could obtain a high film formation rate of 5 nm/s.

Example 9

In this example, as shown in FIG. 11, by using a plasma CVD apparatus having a plurality of cathode electrodes arranged on a concentric circle and a plurality of film-formed substrates arranged on the concentric circle, an a-Si film was formed on the film-formed substrates at a discharge frequency of 100 MHz under the film-formation conditions shown in Table 1.

As a result, even if the plurality of film-formed substrates were arranged on the concentric circle, an entire film non-uniformity was about 12%, the film quality could be sufficient in practical use, e.g., in an electrophotographic photosensitive device, an image input line sensor, or the like. Therefore, an apparatus having high productivity can be provided.

Example 10

In this example, as shown in FIG. 12, by using a parallel-plate-type plasma CVD apparatus having a second ground shield covering a reaction vessel having a plurality of cathode electrodes arranged outside except for high-frequency wave transmission paths extending from a matching circuit to the cathode electrodes and capacitors interposed between a matching circuit and the cathode electrodes, an a-Si film was formed on the film-formed substrate at a discharge frequency of 100 MHz under the film-formation conditions shown in Table 3, and a film thickness nonuniformity was measured.

As a result, the film thickness nonuniformity was about ±10%, in comparison with about ±18% obtained by using a simple plate, and preferable film thickness uniformity was exhibited.

The respective films were considerably influenced by only a plasma distribution. When the film quality of an a-Si film was partially measured in the same film thickness state, the a-Si film could be sufficient in practical use, e.g., in an electrophotographic photosensitive device, an image input line sensor, or the like.

Example 11

In this example, by using the same apparatus as in Example 7, under the same conditions as in Example 7, a glass substrate was arranged on an Al cylindrical substrate surface in an axial direction, an a-Si film was formed. A Cr comb-shaped electrode having a cap of 250 μm for evaluating film quality (electric characteristics) was deposited on the glass substrate subjected to film formation. The electric characteristics of this a-Si film were evaluated by measuring a photosensitivity (photoconductivity σp/dark-conductivity σd). The obtained results are shown in Table 4. Here, the photoconductivity σp is evaluated by a conductivity in irradiation of an He—Ne laser (wavelength: 632.8 nm) having a strength of 1 mW/cm². For comparison of this experiment, an a-Si film was formed on a #7059 glass substrate by a conventional apparatus (FIG. 13) under the same conditions. In this experiment, the value of photoconductivity was evaluated under the following references.

○: photoconductivity is $10^4$ or more, and preferable film characteristics can be obtained.

Δ: photoconductivity is $10^3$ or more, and film characteristics is free from a problem in practice.

x: photoconductivity is $10^3$ or less, and film characteristics is slightly preferable in practice.

TABLE 4

| | upper ←←← axial direction →→→ portion | | | | | | | | | |
|---|---|---|---|---|---|---|---|---|---|---|
| Conventional Apparatus | Δ | o | o | Δ | x | x | Δ | Δ | o | Δ |
| Apparatus of the Present Invention | o | Δ | o | o | Δ | Δ | o | o | o | o |

An a-Si film formed in this example had film quality higher than that of an a-Si film formed by a conventional apparatus and nonuniformity less than that of the a-Si film formed by the conventional apparatus. The a-Si film formed in this example could be sufficiently in practical use, e.g., in an electrophotographic photosensitive device, an image input line sensor, or the like.

According to the present invention described above, in an apparatus in which a counter electrode opposing cathode electrodes is arranged in a reaction vessel which can be reduced in pressure, a high-frequency wave power having 30 MHz or higher and 600 MHz or lower is supplied to the cathode electrodes through a matching circuit to generate a plasma between the cathode electrodes and the counter electrode, and a plasma process is performed to a substrate to be processed arranged on the counter electrode, the plurality of cathode electrodes are arranged outside the reaction vessel, and the reaction vessel between the cathode electrodes and the counter electrode is partially constituted by a dielectric member, so that homogeneous high-frequency wave discharge having a large area can be easily achieved, and a plasma process for a large substrate can be uniformly performed at a high speed. In particular, when a high-frequency wave is supplied from the cathode electrodes to a plasma through the dielectric material, the dielectric material buffers the non-uniformity of the high-frequency wave voltage on the cathode electrodes to make the plasma distribution uniform. For this reason, a uniform plasma can be supplied to a substrate to be processed. In addition, since the cathode electrodes are arranged outside the reaction vessel, the degree of freedom of the design of the cathode electrodes increases, and the optimum shape and optimum constituent material of the cathode electrode can be easily determined. Further, since a high-frequency wave power is separately supplied to a plurality of cathode electrodes, a high-frequency stationary wave can be prevented from easily occurring by decreasing a surface area per cathode, and the arrangement is optimum to form a large-area plasma.

In the apparatus in which a high-frequency wave power is supplied from the same power source to a plurality of cathode electrodes through a matching circuit, the transmission paths between the matching circuit and the cathode electrodes are different from each other in length, and reactances L of the transmission paths are different from each other. For this reason, matching may not be established at a high frequency. However, when capacitors are arranged on the high-frequency wave transmission paths between the matching circuit and the cathode electrodes, the L components can be canceled, and the matching can be reliably established.

When the apparatus has an earth shield covering a reaction vessel having the cathode electrodes arranged outside except for high-frequency wave transmission paths extending from the matching circuit to the cathode electrodes, the high-frequency wave power is prevented from being transmitted to the interior of the reaction vessel through the matching circuit and the atmospheric air in the middle of the high-frequency wave transmission paths. For this reason, the plasma distribution can be prevented from being nonuniform.

What is claimed is:

1. A plasma processing apparatus comprising:

a mounting means for mounting a substrate serving as a counter electrode;

a circumference wall which surrounds the circumference of the substrate mounted by the mounting means; and a plurality of cathode electrodes spaced apart from one another and arranged so as to form a concentric circle outside the circumference wall along a circumferential direction of the circumference wall.

2. The plasma processing apparatus according to claim 1 further comprising a plurality of capacitors, wherein said cathode electrodes are coupled to said capacitors to establish matching of said cathode electrodes, wherein said capacitors are connected to a single power source.

3. The plasma processing apparatus according to claim 1, wherein said plasma processing apparatus comprises a high frequency power supply source for supplying a high frequency power to said plurality of cathode electrodes.

4. The plasma processing apparatus according to claim 3, wherein said high frequency power has a frequency of 30 MHz~600 MHz.

5. A plasma processing apparatus comprising:

a mounting means for mounting a plurality of substrates serving as counter electrodes so as to form a concentric circle with a first diameter;

a plurality of cathode electrodes spaced apart from one another and arranged so as to form a concentric circle with the same center and a second diameter larger than the first diameter; and a circumference wall provided in a circumferential direction of a concentric circle formed between said plurality of substrates and said plurality of cathode electrodes.

6. The plasma processing apparatus according to claim 5 further comprising a plurality of capacitors, wherein said cathode electrodes are coupled to said capacitors to establish matching of said cathode electrodes, wherein said capacitors are connected to a single power source.

7. The plasma processing apparatus according to claim 5, wherein said plasma processing apparatus comprises a high frequency power supply source for supplying a high frequency power to said plurality of cathode electrodes.

8. The plasma processing apparatus according to claim 7, wherein said high frequency power has a frequency of 30 MHz~600 MHz.

* * * * *